US011699585B2

(12) United States Patent
Hsu et al.

(10) Patent No.: US 11,699,585 B2
(45) Date of Patent: Jul. 11, 2023

(54) METHODS OF FORMING HARDMASKS

(71) Applicant: Applied Materials, Inc., Santa Clara, CA (US)

(72) Inventors: Jui-Yuan Hsu, San Jose, CA (US); Pramit Manna, Santa Clara, CA (US); Bhaskar Kumar, San Jose, CA (US); Karthik Janakiraman, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 268 days.

(21) Appl. No.: 17/075,967

(22) Filed: Oct. 21, 2020

(65) Prior Publication Data
US 2022/0122835 A1 Apr. 21, 2022

(51) Int. Cl.
*H01L 21/02* (2006.01)
*H01L 21/033* (2006.01)
(52) U.S. Cl.
CPC .... *H01L 21/0234* (2013.01); *H01L 21/02115* (2013.01); *H01L 21/02274* (2013.01); *H01L 21/0332* (2013.01)
(58) Field of Classification Search
None
See application file for complete search history.

(56) References Cited

U.S. PATENT DOCUMENTS

| 2005/0112506 | A1 | 5/2005 | Czech et al. |
| 2011/0223765 | A1* | 9/2011 | Rajagopalan ..... C23C 16/45523 438/791 |
| 2015/0200094 | A1 | 7/2015 | Underwood et al. |
| 2018/0274089 | A1 | 9/2018 | Yang et al. |
| 2018/0358222 | A1 | 12/2018 | Venkatasubramanian et al. |
| 2019/0207106 | A1 | 7/2019 | Dobisz et al. |
| 2022/0033975 | A1* | 2/2022 | Shi ...................... C23C 14/0635 |

OTHER PUBLICATIONS

International Search Report and Written Opinion dated Feb. 3, 2022 for Application No. PCT/US2021/053826.

* cited by examiner

*Primary Examiner* — Asok K Sarkar
(74) *Attorney, Agent, or Firm* — Patterson + Sheridan, LLP

(57) ABSTRACT

Embodiments of the present disclosure generally relate to methods of forming hardmasks. Embodiments described herein enable, e.g., formation of carbon-containing hardmasks having reduced film stress. In an embodiment, a method of processing a substrate is provided. The method includes positioning a substrate in a processing volume of a processing chamber and depositing a diamond-like carbon (DLC) layer on the substrate. After depositing the DLC layer, the film stress is reduced by performing a plasma treatment, wherein the plasma treatment comprises applying a radio frequency (RF) bias power of about 100 W to about 10,000 W.

20 Claims, 4 Drawing Sheets

METHODS OF FORMING HARDMASKS

BACKGROUND

Field

Embodiments of the present disclosure generally relate to methods of forming hardmasks, and more specifically to methods of reducing film stress in hardmasks.

Description of the Related Art

Carbon-containing hardmasks are typically employed for etch-resistant masks in patterning and line-width trimming applications due to, e.g., their mechanical properties, high etch selectivity, and easy stripability in oxygen plasma. Typically, carbon-containing hardmasks are formed by plasma-enhanced chemical vapor deposition (PECVD). One issue not adequately addressed by the current state-of-the-art is that the shape integrity of the structures formed may be lessened where the materials used to form the hardmask layer include an internal stress. For example, where a hardmask material includes an internal stress, e.g., internal compressive stress or tensile stress, by virtue of the microstructure of the material, the hardmask material may deform. The deformed hardmask layer can then transfer the deformed pattern to the underlying dielectric material when the hardmask is used during, e.g., an etch operation. This phenomenon is sometimes referred to as line warpage or wiggling. Wiggling not only deforms the mechanically-weak, porous dielectric, but also degrades device performance.

There is a need for new and improved methods of forming carbon-containing hardmasks having, e.g., reduced film stress.

SUMMARY

Embodiments of the present disclosure generally relate to methods of forming hardmasks. Embodiments described herein enable, e.g., formation of carbon-containing hardmasks having reduced film stress.

In an embodiment, a method of processing a substrate is provided. The method includes positioning a substrate in a processing volume of a processing chamber and depositing a diamond-like carbon (DLC) layer on the substrate. After depositing the DLC layer, a film stress of the DLC layer is reduced by performing a plasma treatment, wherein the plasma treatment includes applying a radio frequency (RF) bias power of about 100 W to about 10,000 W.

In another embodiment, a method of processing a substrate is provided. The method includes positioning a substrate in a processing volume of a processing chamber and depositing a DLC layer on the substrate. After depositing the DLC layer, a film stress of the DLC layer is reduced by performing a plasma treatment, wherein the plasma treatment includes flowing a non-reactive gas into the processing volume. The plasma treatment further includes generating a plasma from the non-reactive gas in the processing volume to treat the DLC layer by applying a RF bias power of about 100 W to about 10,000 W.

In another embodiment, a method of processing a substrate is provided. The method includes positioning a substrate in a processing volume of a processing chamber and depositing a DLC layer on the substrate. After depositing the DLC layer, the film stress is reduced by performing a plasma treatment, wherein the plasma treatment includes flowing a non-reactive gas into the processing volume, the non-reactive gas comprising $N_2$, argon, helium, or combinations thereof. The plasma treatment further includes generating a plasma from the non-reactive gas in the processing volume to treat the DLC layer by applying a RF bias power of about 100 W to about 10,000 W.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

DETAILED DESCRIPTION

Embodiments of the present disclosure generally relate to methods of forming hardmasks. The new and improved methods described herein enable formation of carbon-containing hardmasks (e.g., diamond-like carbon (DLC) hardmasks) having reduced film stress. Briefly, and in some examples, a post-deposition plasma treatment employing a non-reactive gas is used to reduce the film stress, e.g., compressive stress, of the carbon-containing hardmask. Thus, embodiments described herein mitigate wiggling issues of hardmasks during substrate processing. Further, embodiments described herein enable manipulation of the film stress by, e.g., adjusting the radio frequency (RF) power of the plasma treatment. Not only is the hardmask film stress reduced by methods described herein, the refractive index and uniformity of the hardmask remain unchanged.

Figure 1:
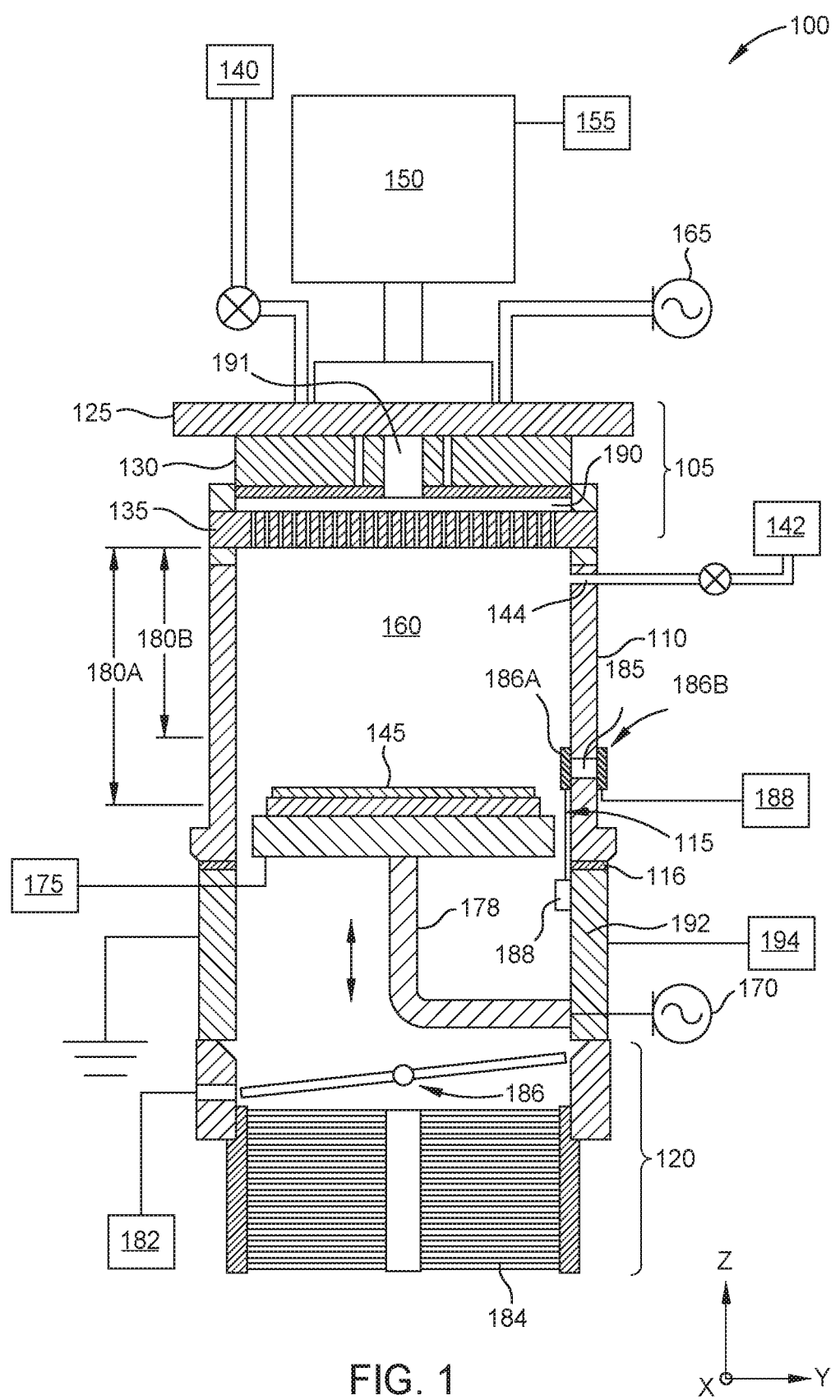
FIG. 1 is a schematic side cross-sectional view of an example processing chamber according to at least one embodiment of the present disclosure.

FIG. 1 is a schematic side cross-sectional view of an example processing chamber 100 suitable for conducting a deposition process and post-deposition plasma treatment according to at least one embodiment. Suitable chambers may be obtained from Applied Materials, Inc. located in Santa Clara, Calif. It is to be understood that the system described below is an exemplary processing chamber and other chambers, including chambers from other manufacturers, may be used with or modified to accomplish embodiments of the present disclosure (e.g., method 300 described below). In some embodiments, the processing chamber 100 may be configured to deposit advanced patterning films onto a substrate, such as hardmask films, for example amorphous carbon hardmask films, and/or to perform post-deposition plasma treatment operations.

The processing chamber 100 includes a lid assembly 105, a spacer 110 disposed on a chamber body 192, a substrate support 115, and a variable pressure system 120. The lid assembly 105 includes a lid plate 125 and a heat exchanger 130. In the embodiment shown, the lid assembly 105 also includes a showerhead 135. However, in other embodiments, the lid assembly 105 includes a concave or dome-shaped gas introduction plate. The lid assembly 105 is coupled to a first processing gas source 140. The first processing gas source 140 contains precursor gases for forming films on a substrate 145 supported on the substrate support 115. As an example, the first processing gas source 140 includes precursor gases such as carbon-containing gases, hydrogen-containing gases, non-reactive gases (e.g., helium), among others. In a specific example, the carbon-containing gas includes acetylene ($C_2H_2$). The first processing gas source 140 provides precursors gases to a plenum 190 disposed in the lid assembly 105. The lid assembly includes one or more channels for directing precursor gases from the first processing gas source 140 into the plenum 190. From the plenum, the precursor gases flow through the showerhead 135 into a processing volume 160. In some embodiments, a second processing gas source 142 is fluidly coupled to the processing volume 160 via an inlet 144 disposed through the spacer 110. As an example, the second processing gas source 142 includes precursor gases such as carbon-containing gases, hydrogen-containing gases, non-reactive gases (e.g., helium), among others, for example $C_2H_2$. In some embodiments, a total flow rate of precursor gases into the processing volume 160 is about 100 sccm to about 2 slm. The flow of precursor gases in the processing volume 160 via the second processing gas source 142 modulates the flow of precursor gases through the showerhead 135 such that the precursor gases are uniformly distributed in the processing volume 160. In one example, a plurality of inlets 144 may be radially distributed about the spacer 110. In such an example, gas flow to each of the inlets 144 may be separately controlled to further facilitate gas uniformity within the processing volume 160.

The lid assembly 105 is also coupled to an optional remote plasma source 150. The optional remote plasma source 150 is coupled to a gas source 155 for providing gases to the processing volume 160 formed inside the spacer 110 between the lid assembly 105 and the substrate 145. In one example, gases are provided through a central conduit 191 formed axially through the lid assembly 105. In another example, gases are provided through the same channels which direct precursor gases.

In addition to or as an alternative to the optional remote plasma source 150, the lid assembly 105 is coupled to a first or upper radio frequency (RF) power source 165. The first RF power source 165 facilitates maintenance or generation of plasma, such as a plasma generated from a gas. In one example, the optional remote plasma source 150 is omitted, and the gas is ionized into a plasma in situ via the first RF power source 165. The substrate support 115 is coupled to a second or lower RF power source 170. The first RF power source 165 may be a high frequency RF power source (for example, about 13.56 MHz to about 120 MHz) and the second RF power source 170 may be a low frequency RF power source (for example, about 2 MHz to about 13.56 MHz). It is to be noted that other frequencies are also contemplated. In some implementations, the second RF power source 170 is a mixed frequency RF power source, providing both high frequency and low frequency power. Utilization of a dual frequency RF power source, particularly for the second RF power source 170, can improve film deposition and/or the post-deposition plasma treatment. In some examples, utilizing a second RF power source 170 provides dual frequency powers. In some embodiments, a first frequency of, e.g., about 2 MHz to about 13.56 MHz, improves the implantation of species into the deposited film, while a second frequency of, e.g., about 13.56 MHz to about 120 MHz, and increases ionization and deposition rate of the film.

One or both of the first RF power source 165 and the second RF power source 170 can be utilized in creating or maintaining a plasma in the processing volume 160. For example, the second RF power source 170 may be utilized during a deposition process and the first RF power source 165 may be utilized during a post-deposition plasma treatment process (alone or in conjunction with the optional remote plasma source 150). In some processes, the first RF power source 165 is used in conjunction with the second RF power source 170. During a deposition process, an etch process, or a post-deposition process, one or both of the first RF power source 165 and the second RF power source 170 can provide a power of, e.g., about 100 Watts (W) to about 20,000 W in the processing volume 160 to facilitate ionization of a precursor gas. In some embodiments, at least one of the first RF power source 165 and the second RF power source 170 are pulsed. In at least one embodiment, RF power is applied to the lid plate 125.

The substrate support 115 is coupled to an actuator 175 (e.g., a lift actuator) that provides movement thereof in the Z direction. The substrate support 115 is also coupled to a facilities cable 178 that is flexible which allows vertical movement of the substrate support 115 while maintaining communication with the second RF power source 170 as well as other power and fluid connections. The spacer 110 is disposed on the chamber body 192. A height of the spacer 110 allows movement of the substrate support 115 vertically within the processing volume 160. The height of the spacer 110 is about 0.5 inches to about 20 inches. In one example, the substrate support 115 is movable from a first distance 180A to a second distance 180B relative to the lid assembly 105 (for example, relative to a lower surface of the showerhead 135). In some embodiments, the second distance 180B is about ⅔ of the first distance 180A. For example, the difference between the first distance 180A and the second distance is about 5 inches to about 6 inches. Thus, from the position shown in FIG. 1, the substrate support 115 is movable by about 5 inches to about 6 inches relative to a lower surface of the showerhead 135. In another example, the substrate support 115 is fixed at one of the first distance 180A and the second distance 180B.

The variable pressure system 120 includes a first pump 182 and a second pump 184. The first pump 182 is a roughing pump that may be utilized during a substrate transfer process. A roughing pump is generally configured for moving higher volumetric flow rates and/or operating a relatively higher (though still sub-atmospheric) pressure. In a non-limiting example, the first pump 182 maintains a pressure within the processing chamber of, e.g., less than about 500 mTorr, such as less than about 50 mTorr during one or more operations described herein. In another example, the first pump 182 maintains a pressure within the processing chamber 100 of, e.g., less than about 500 mTorr, such as less than about 50 mTorr, such as from about 0.5 mTorr to about 10 Torr or from about 5 mTorr to about 15 mTorr. Utilization of a roughing pump during operations described herein facilitates relatively higher pressures and/or volumetric flow of gas.

The second pump 184 may be a turbo pump and/or a cryogenic pump. The second pump 184 can be utilized during a deposition process and/or a post-deposition plasma treatment process. The second pump 184 is generally configured to operate a relatively lower volumetric flow rate and/or pressure. In a non-limiting example, the second pump 184 is configured to maintain the processing volume 160 of the process chamber at a pressure of, e.g., less than about 500 mTorr, such as less than about 50 mtorr. In another example, the second pump 184 maintains a pressure within the processing chamber 100 of, e.g., less than about 500 mTorr, such as less than about 50 mTorr, such as from about 0.5 mtorr to about 10 Torr or from about 5 mTorr to about 15 mTorr.

In some embodiments, both of the first pump 182 and the second pump 184 are utilized during a deposition process and/or a post-deposition plasma treatment process to maintain the processing volume 160 of the process chamber at a pressure of, e.g., less than about 500 mTorr, such as less than about 50 mTorr. In other embodiments, the first pump 182 and the second pump 184 maintain the processing volume 160 at a pressure of, e.g., from about 0.5 mtorr to about 10 Torr or from about 5 mTorr to about 15 mTorr. A valve 186 is utilized to control the conductance path to one or both of the first pump 182 and the second pump 184. The valve 186 also provides symmetrical pumping from the processing volume 160.

The processing chamber 100 also includes a substrate transfer port 185. The substrate transfer port 185 is selectively sealed by an interior door 186A and an exterior door 186B. Each of the interior door 186A and exterior door 186B are coupled to actuators 188 (i.e., a door actuator). The interior door 186A and exterior door 186B facilitate vacuum sealing of the processing volume 160. The interior door 186A and exterior door 186B also provide symmetrical RF application and/or plasma symmetry within the processing volume 160. In one example, at least the interior door 186A is formed of a material that facilitates conductance of RF power, such as stainless steel, aluminum, or alloys thereof. Seals 116, such as O-rings, disposed at the interface of the spacer 110 and the chamber body 192 may further seal the processing volume 160. A controller 194 coupled to the processing chamber 100 is configured to control aspects of the processing chamber 100 during substrate processing.

Figure 2A:
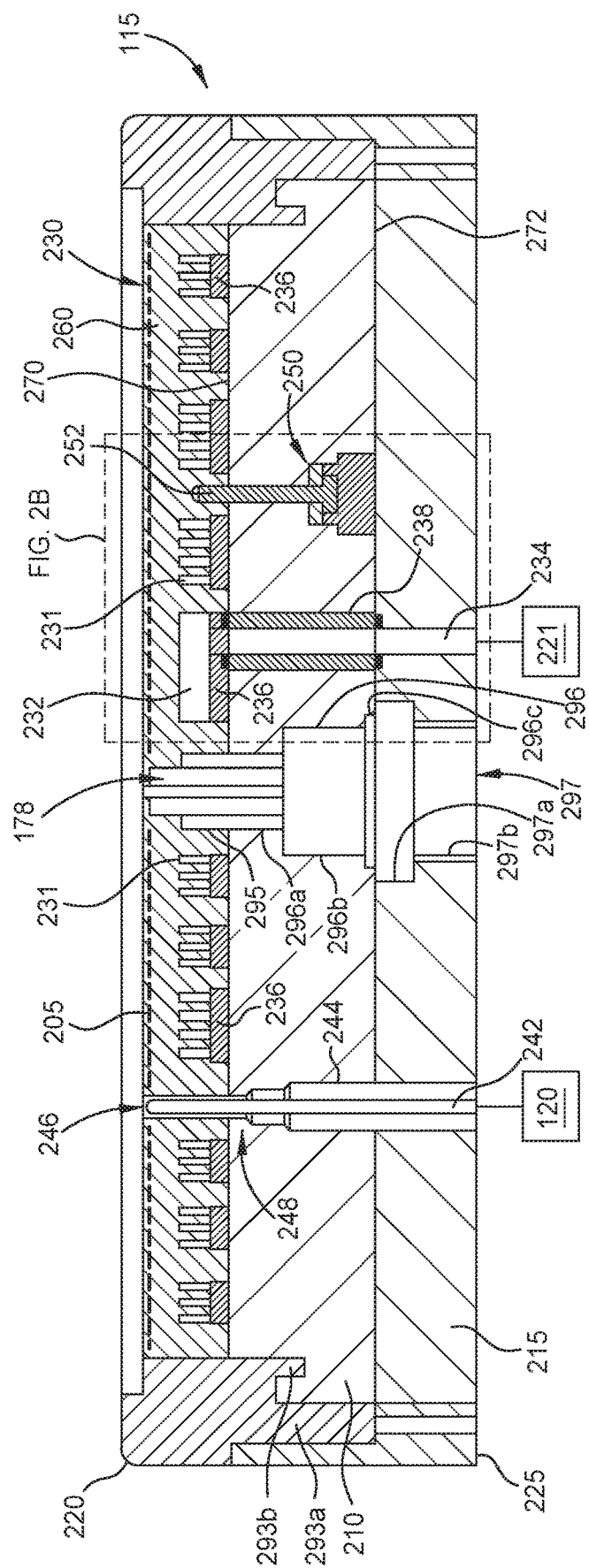
FIG. 2A is a schematic sectional view of an example substrate support according to at least one embodiment of the present disclosure.
Figure 2B:
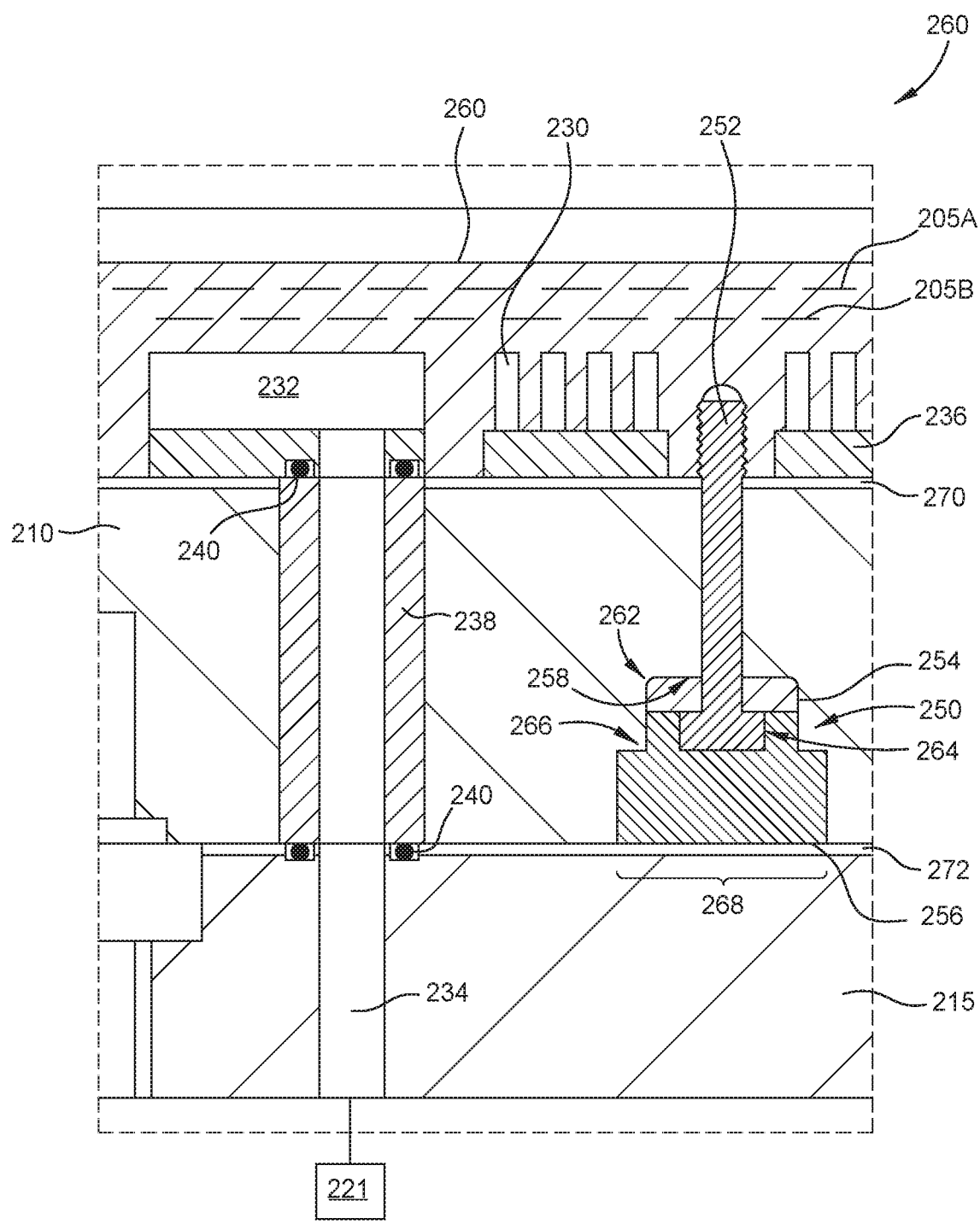
FIG. 2B is an enlarged sectional view of a portion of the example substrate support shown in FIG. 2A according to at least one embodiment of the present disclosure.

FIG. 2A is a schematic sectional view of one embodiment of the substrate support 115. FIG. 2B is an enlarged sectional view of a portion of the substrate support 115 shown in FIG. 2A. The substrate support 115 includes an electrostatic chuck 230. The electrostatic chuck 230 includes a puck 260. The puck 260 includes one or more electrodes 205 embedded therein (a first electrode 205A and a second electrode 205B is shown in FIG. 2B). The first electrode 205A is utilized as a chucking electrode and the second electrode 205B is utilized as an RF biasing electrode. The substrate support 115 may be biased by providing RF power at a frequency of, e.g., from about 300 kHz to about 120 MHz, such as from about 300 kHZ to about 60 MHz, to the second electrode 205B. The frequency provided to the second electrode 205B may be pulsed. The puck 260 is typically formed from a dielectric material, such as a ceramic material, for example aluminum nitride (AlN).

The puck 260 is supported by a dielectric plate 210 and a base plate 215. The dielectric plate 210 may be formed from an electrically insulative material, such as quartz, or a thermoplastic material, such as high performance plastics sold under the tradename REXOLITE®. The base plate 215 may be made from a metallic material, such as aluminum. During operation, the base plate 215 is coupled to ground or is electrically floating while the puck 260 is RF hot. At least the puck 260 and the dielectric plate 210 are surrounded by an insulator ring 220. The insulator ring 220 may be made of a dielectric material such as quartz, silicon, or a ceramic material. The base plate 215 and a portion of the insulator ring 220 is surrounded by a ground ring 225 made of aluminum. The insulator ring 220 prevents or minimizes arcing between the puck 260 and the base plate 215 during operation. An end of the facilities cable 178 is shown in openings formed in the puck 260, the dielectric plate 210, and the base plate 215. Power for the electrodes of the puck 260, as well as fluids from a gas supply (not shown) to the substrate support 115, is provided by the facilities cable 178.

An edge ring (not shown) is disposed adjacent to an inner circumference of the insulator ring 220. The edge ring may comprise a dielectric material, such as quartz, silicon, cross-linked polystyrene and divinylbenzene (e.g., REXOLITE®), PEEK, $Al_2O_3$, AlN, among others. Utilizing an edge ring comprising such a dielectric material helps modulate the plasma coupling and the plasma properties, such as the voltage on the substrate support ($V_{dc}$), without having to change the plasma power, thus improving the properties of the hardmask films deposited on substrates. By modulating the RF coupling to the wafer or substrate through the material of the edge ring, the modulus of the film can be decoupled from the stress of the film.

Each of the puck 260, the dielectric plate 210, and the base plate 215 include a respectively axially-aligned opening formed therein or therethrough for accommodating the facilities cable 178. The puck 260 includes an opening 295 shaped to engage the facilities cable 178. For example, the opening 295 may be configured as a female receptacle for receiving the facilities cable 178. The dielectric plate 210 includes an opening 296 axially aligned with the opening 295. The opening 296 includes an upper portion 296a having a diameter about equal to the diameter of the opening 295, a middle portion 296b having a diameter with a diameter greater than the diameter of the upper portion, and a lower portion 296c having a diameter greater than a diameter of the middle portion 296b. The base plate 215 includes an opening 297 having an upper portion 297a with a first diameter and a lower portion 297b with a second diameter less than the first diameter. The multiple diameters of the openings 296 and 297 can facilitate securing of the facilities cable 178 therein.

The puck 260 includes a plurality of fluid channels 231 formed therein. Each of the fluid channels 231 are in fluid communication with an inlet channel 232. The inlet channel 232 is fluidly coupled to an inlet conduit 234. The inlet conduit 234 is coupled to the coolant source 221. Each of the fluid channels 231 and the inlet channel 232 are sealed by a cap plate 236. The cap plates 236 may be made of the same material as the puck 260, or aluminum, and can be welded or otherwise bonded to the puck 260 to seal the fluid channels 231 and the inlet conduit 234. While not shown, an outlet conduit, similar to the inlet conduit 234, is provided in the substrate support 115 such that the cooling fluid can be recirculated therein.

A portion of the inlet conduit 234 is formed by a tubular member 238. The tubular member 238 is formed from a dielectric material such as a ceramic material. Seals 240 are provided at ends of the tubular member 238 adjacent to the cap plates 236 and the base plate 215 as shown in FIG. 2B.

The tubular member 238 prevents arcing that may be caused by the cooling fluid flowing therethrough. The tubular member 238 may also thermally insulate the dielectric plate 210 from the relatively cold cooling fluid flowing therein in order to prevent cracking of the dielectric plate 210.

The substrate support 115 also includes a plurality of lift pins 242 (only one is shown in FIG. 2A). Each of the lift pins 242 are movably disposed in a dielectric bushing 244. Each of the lift pins 242 may be formed from a ceramic material, such as AlN, sapphire, quartz, or the like. The dielectric bushing 244 is provided in or through each of the puck 260, the dielectric plate 210 and the base plate 215. The dielectric bushing 244 is made of a polymer material, such as a polytetrafluoroethylene (PTFE) material. The dielectric bushing 244 includes an opening 246 along the length direction thereof where the lift pin 242 is guided. The opening 246 is sized slightly larger than the dimension (diameter) of the lift pin 242 such that a conductance path is formed in the dielectric bushing 244. For example, the opening 246 is coupled to the variable pressure system 120 such that vacuum conductance is provided between the processing volume 160 and through the dielectric bushing 244 to the variable pressure system 120. The conductance path provided by the opening 246 prevents arcing of the lift pins. The dielectric bushing 244 includes a plurality of steps 248 which are varied diameter sections. The steps 248 reduce arcing between the puck 260 and the base plate 215 by increasing the length of the path electricity may travel, as well as by introducing angular turns along the path.

The substrate support 115 also includes a plurality of fastener devices 250 (only one is shown). The fastener devices 250 are utilized to attach the puck 260 to the dielectric plate 210. Each fastener device 250 includes a fastener 252, a washer 254 and a fastener cap 256 (the washer 254 and fastener cap 256 are shown in FIG. 2B). When the fastener 252 is tightened, the washer 254 is urged against a surface 258 of an opening 268 formed in the dielectric plate 210. The washer 254 and the fastener 252 are made from a metallic material, such as stainless steel. The washer 254 includes a rounded upper corner 262. The rounded upper corner 262 prevents cracking of the material of the dielectric plate 210 when the fastener 252 is tightened.

The fastener cap 256 is utilized to fill the remainder of the opening 268 in the dielectric plate 210. The fastener cap 256 includes a pocket 264 that is sized to receive the head of the fastener 252. The fastener cap 256 is formed from a dielectric material, such as a polymer, for example, polyether ether ketone (PEEK). The outer surface of the fastener cap 256 includes a step 266. The step 266 reduces arcing between the puck 260 and the base plate 215 by increasing the length of the path electricity may travel.

The substrate support 115 also includes a plurality of gaps between layers thereof. A first gap 270 is provided between the puck 260 and the dielectric plate 210. A second gap 272 is provided between the dielectric plate 210 and the base plate 215. The first gap 270 and the second gap 272 are in fluid communication with a gas supply (not shown). Fluids from the gas supply can be flown in the first gap 270 and the second gap 272 to prevent condensation between adjacent layers. Fluids in the first gap 270 and the second gap 272 are sealed on ends of the substrate support 115 by the edge ring. The edge ring may be sized to provide a controlled leakage of fluids from the first gap 270 and the second gap 272.

Figure 3:
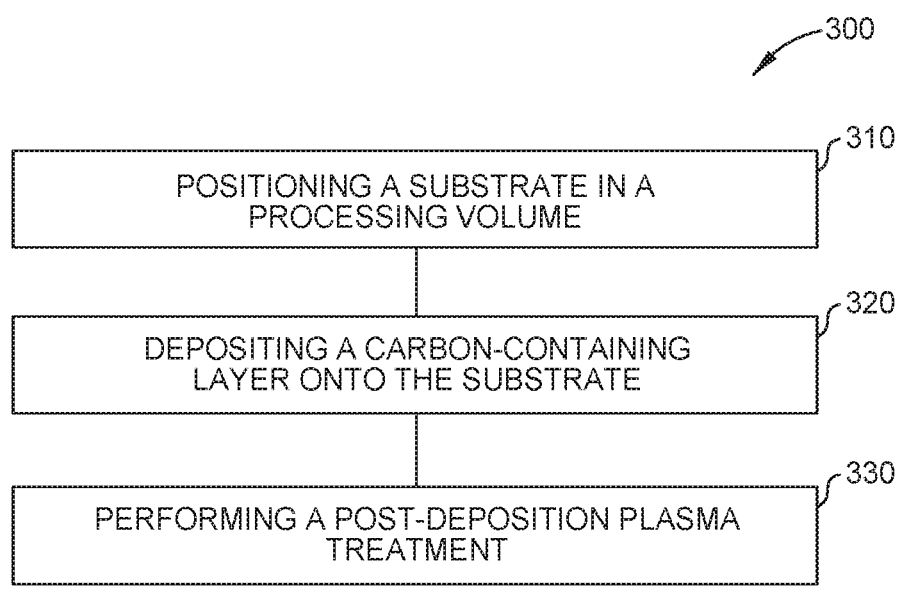
FIG. 3 is a flowchart showing selected operations of an example method of processing a substrate according to at least one embodiment of the present disclosure To facilitate understanding, identical reference numerals have been used, where possible, to designate identical elements that are common to the figures. It is contemplated that elements and features of one embodiment may be beneficially incorporated in other embodiments without further recitation.

FIG. 3 is a flowchart showing selected operations of an example method 300 of processing a substrate according to at least one embodiment of the present disclosure. The method 300 includes positioning (e.g., introducing, transferring, conveying, etc.) a substrate in a processing volume of a processing chamber at operation 310. As an example, the substrate, e.g., substrate 145, is transferred into the processing chamber 100 and onto the substrate support 115 by any suitable means, such as through the substrate transfer port 185. The substrate support 115 can be adjusted to a processing position by an actuator 175 as depicted in FIG. 1. The substrate support 115 can include an electrostatic chuck, such as electrostatic chuck 230. The substrate can include one or more materials such as nitride, oxide, silicon, and/or a metal (e.g., tungsten, molybdenum, titanium, etc.).

The method 300 further includes depositing a carbon-containing layer on the substrate at operation 320. The carbon-containing layer can be a DLC layer. Various methods can be used to form the DLC layer. Briefly, and as a non-limiting example, one or more process gases from one or more sources are provided to the processing volume 160 through, e.g., showerhead 135, such that the one or more process gases is uniformly distributed in the processing volume 160. A plurality of inlets 144 may be radially distributed about the spacer 110, and gas flow to each of the plurality of inlets 144 may be separately controlled to further facilitate gas uniformity within the processing volume 160. The process gas for deposition includes one or more carbon-containing compounds, such as acetylene. An energized process gas is generated by plasma under plasma conditions, using, e.g., first RF power source 165 and/or second RF power source 170 to supply RF power at any suitable frequency or power level for plasma generation. The RF power creates an electromagnetic field that energizes the process gas within the processing volume 160. A carbon-containing layer is then deposited on the substrate.

After depositing the carbon-containing layer (e.g., the DLC layer), a post-deposition plasma treatment is performed at operation 330. Here, as a non-limiting example, one or more non-reactive gases are provided to the processing volume 160 through, e.g., showerhead 135 such that the one or more non-reactive or inert gases is uniformly distributed in the processing volume 160. In one example, a plurality of inlets 144 may be radially distributed about the spacer 110, and gas flow to each of the plurality of inlets 144 may be separately controlled to further facilitate gas uniformity within the processing volume 160. Illustrative, but non-limiting, examples of the one or more non-reactive or inert gases include $N_2$, argon, helium, neon, krypton, xenon, radon, or combinations thereof. An energized gas, containing high-energy ions, is generated from the one or more non-reactive gases by plasma under plasma conditions, using, e.g., first RF power source 165 and/or second RF power source 170 to supply RF power at any suitable frequency or power level for plasma generation. The RF power creates an electromagnetic field that energizes the one or more non-reactive or inert gases within the processing volume 160. Local thermal spikes are created within the carbon-containing film upon implantation of the high-energy ions. The local increases in temperature promote a thermally-activated relaxation of the chemical bonds into $sp^2$-hybridization, resulting in the carbon-containing layer having reduced stress.

The post-deposition plasma treatment includes one or more process parameters as described below.

A temperature of the substrate can be about 40° C. or less, such as from about −40° C. to about 40° C., such as from about −30° C. to about 30° C., such as from about −20° C. to about 20° C., such as from about −10° C. to about 10° C. In at least one embodiment, the temperature of the substrate support ranges from $T_1$ to $T_2$ (in units of ° C.), where each of $T_1$ and $T_2$ is independently about −40, about −35, about −30, about −25, about −20, about −15, about −10, about −5, about 0, about 5, about 10, about 15, about 20, about 25, about 30, about 35, or about 40, as long as $T_1$<$T_2$.

A pressure within the processing volume can be about 500 millitorr (mTorr) or less, such as about 400 mTorr or less, such as about 300 mTorr or less, such as about 200 mTorr or less, such as about 100 mTorr or less, such as about 50 mTorr or less, such as about 20 mTorr or less, for example from about 5 mTorr to about 100 mTorr, such as from about 20 mTorr to about 80 mTorr, such as from about 40 mTorr to about 60 mTorr. In at least one embodiment, the pressure within the processing volume ranges from $P_1$ to $P_2$ (in units of mTorr), where each of $P_1$ and $P_2$ is independently about 1, about 5, about 10, about 15, about 20, about 25, about 30, about 35, about 40, about 45, about 50, about 55, about 60, about 65, about 70, about 75, about 80, about 85, about 90, about 95, or about 100, as long as $P_1$<$P_2$.

A flow rate of one or more non-reactive or inert gases can be about 10,000 standard cubic centimeters per minute (sccm) or less for a 300 mm-sized substrate, such as about 5,000 sccm or less, such as from about 500 sccm to about 5,000 sccm, such as from about 1,000 sccm to about 4,000 sccm, such as from about 2,000 sccm to about 3,000 sccm. In at least one embodiment, the flow rate of the one or more non-reactive or inert gases for a 300 mm-sized substrate ranges from flow rate$_1$ to flow rate$_2$ (in units of sccm), where each of flow rate$_1$ and flow rate$_2$ is independently about 50, about 100, about 200, about 300, about 400, about 500, about 600, about 700, about 800, about 900, about 1,000, about 1,100, about 1,200, about 1,300, about 1,400, about 1,500, about 1,600, about 1,700, about 1,800, about 1,900, about 2,000, about 2,100, about 2,200, about 2,300, about 2,400, about 2,500, about 2,600, about 2,700, about 2,800, about 2,900, about 3,000, about 3,100, about 3,200, about 3,300, about 3,400, about 3,500, about 3,600, about 3,700, about 3,800, about 3,900, about 4,000, about 4,100, about 4,200, about 4,300, about 4,400, about 4,500, about 4,600, about 4,700, about 4,800, about 4,900, or about 5,000, as long as flow rate$_1$<flow rate$_2$.

An RF source power applied to the lid plate (e.g., lid plate 125) can be from about 100 Watts (W) to about 10,000 W, such as from about 500 W to about 5,000 W, such as from about 1,000 W to about 2,000 W or from about 2,500 W to about 4,000 W. In at least one embodiment, the RF source power ranges from power$_1$ to power$_2$ (in units of W) where each of power$_1$ and power$_2$ is independently about 100, about 500, about 1,000, about 1,500, about 2,000, about 2,500, about 3,000, about 3,500, about 4,000, about 4,500, about 5,000, about 5,500, about 6,000, about 6,500, about 7,000, about 7,500, about 8,000, about 8,500, about 9,000, about 9,500, or about 10,000 W, as long as power$_1$<power$_2$.

An RF bias power applied to the substrate support 115 during the post-deposition plasma treatment can be from about 100 Watts (W) to about 10,000 W, such as from about 100 W to about 1,000 W, such as from about 200 W to about 800 W, or from about 500 W to about 5,000 W, such as from about 1,000 W to about 2,000 W or from about 2,500 W to about 4,000 W. In at least one embodiment, the RF bias power during the post-deposition plasma treatment ranges from power$_3$ to power$_4$ (in units of W) where each of power$_3$ and power$_4$ is independently about 100, about 200, about 300, about 400, about 500, about 600, about 700, about 800, about 900, about 1,000, about 1,000, about 1,100, about 1,200, about 1,300, about 1,400, about 1,500, about 1,600, about 1,700, about 1,800, about 1,900, about 2,000, about 2,100, about 2,200, about 2,300, about 2,400, about 2,500, about 2,600, about 2,700, about 2,800, about 2,900, about 3,000, about 3,100, about 3,200, about 3,300, about 3,400, about 3,500, about 3,600, about 3,700, about 3,800, about 3,900, about 4,000, about 4,100, about 4,200, about 4,300, about 4,400, about 4,500, about 4,600, about 4,700, about 4,800, about 4,900, or about 5,000, as long as power$_3$<power$_4$. A frequency of the RF bias power can be from about 100 kilohertz (kHz) to about 120 megahertz (MHz), such as from about 400 kHz to about 120 MHz, such as from about 1 MHz to about 60 MHz, such as from about 2 MHz and about 27 MHz, such as about 13.5 MHz. The frequency can be pulsed.

The plasma employed can have a plasma density on the order of about 10 ions/cm$^3$ or more, such as from about 100 ions/cm$^3$ to about $1\times10^{15}$ ions/cm$^3$, such as from about $1\times10^7$ ions/cm$^3$ to about $1\times10^{15}$ ions/cm$^3$, such as from about $1\times10^8$ ions/cm$^3$ to about $1\times10^{14}$ ions/cm$^3$, such as from about $1\times10^9$ ions/cm$^3$ to about $1\times10^{13}$ ions/cm$^3$, such as from about $1\times10^{10}$ ions/cm$^3$ to about $1\times10^{12}$ ions/cm$^3$. In at least one embodiment, the plasma density (PD) ranges from time$_1$ to time$_2$ (in units of s) where each of PD$_1$ and PD$_2$ is independently about 1 ions/cm$^3$, about 10 ions/cm$^3$, about 100 ions/cm$^3$, about $1\times10^3$ ions/cm$^3$, about $1\times10^4$ ions/cm$^3$, about $1\times10^5$ ions/cm$^3$, about $1\times10^6$ ions/cm$^3$, about $1\times10^7$ ions/cm$^3$, about $1\times10^8$ ions/cm$^3$, about $1\times10^9$ ions/cm$^3$, about $1\times10^{10}$ ions/cm$^3$, about $1\times10^{11}$ ions/cm$^3$, about $1\times10^{12}$ ions/cm$^3$, about $1\times10^{13}$ ions/cm$^3$, about $1\times10^{14}$ ions/cm$^3$, or about $1\times10^{15}$ ions/cm$^3$, as long as PD$_1$<PD$_2$. The plasma density can be measured in the processing volume of the substrate processing chamber.

The amount of time for the post-deposition plasma treatment of the carbon-containing layer can be about 1 second (s) or more, such as from about 1 s to about 60 minutes (min), 30 s to about 30 min, such as from about 1 min to about 10 min.

In some embodiments, the carbon-containing layer after the post-deposition plasma treatment has at least 10% spa-hybridized atoms as determined by Raman spectroscopy. That is, the spa-hybridized content of the carbon-containing layer can be at least 10%. The spa-hybridized content can be from about 1% to about 100%, such as from about 5% to about 90%, such as from about 10% to about 75%, such as from about 25% to about 50%, or at least about 60%. In at least one embodiment, the sp$^3$-hybridized content of the carbon-containing layer ranges from content$_1$ to content$_2$ (in units of %) where each of content$_1$ and content$_2$ is independently about 10, about 15, about 20, about 25, about 30, about 35, about 40, about 45, about 50, about 55, about 60, about 65, about 70, about 75, about 80, about 85, about 90, about 95, or about 100, as long as content$_1$<content$_2$.

In some embodiments, the film stress of the carbon-containing layer (e.g., the DLC layer) is reduced by about 5% or more as a result of the post-deposition plasma treatment, such as from about 10% to about 50%, such as from about 15% to about 45%, such as from about 20% to about 40%, such as from about 25% to about 35%. In at least one embodiment, the reduction in film stress ranges from percent$_1$ to percent$_2$ (in units of %) where each of percent$_1$ and percent$_2$ independently about 10, about 15, about 20, about 25, about 30, about 35, about 40, about 45, or about 50, as long as percent$_1$<percent$_2$. Film stress is determined by ellipsometry.

The following examples are not intended to limit any embodiment described herein.

EXAMPLES

High-density carbon films (DLC films) were fabricated by magnetron PECVD. Hydrocarbon-containing gas mixtures were flowed into a process chamber, having substrate positioned on an electrostatic chuck. The depositions were carried out at a temperature of about 10° C., a pressure of about 10 mTorr, and plasma was generated by applying about 4 kW RF bias to the electrostatic chuck.

Post-deposition plasma treatment was then performed on the DLC films using argon (flow rate of about 700 sccm), helium (flow rate of about 1200 sccm), pressure (about 25 mTorr), and the plasma power (RF bias power) shown in Table 1. Results for the post-deposition plasma treatment are shown in Table 1.

TABLE 1

| Property | Ex. 1 | Ex. 2 | Ex. 3 | Ex. 4 |
| --- | --- | --- | --- | --- |
| Thickness of DLC layer, kÅ | 15 | 15 | 5 | 5 |
| Plasma power, W | 200 | 500 | 200 | 500 |
| Stress, MPa | −215 | −128 | −236 | −157 |
| Range/2 non-uniformity | — | — | 6.21% | 6.53% |
| Refractive index at 633 nm | — | — | 2.384 | 2.381 |

Table 1 shows that the post-deposition plasma treatment reduces the film stress of the DLC layer for both 5 kA and 15 kA films. This phenomenon is likely due to the creation of local thermal spikes upon implantation with high energy ions. These local increases in temperature promote a thermally-activated relaxation of the chemical bonds into $sp^2$-hybridization, resulting in the carbon-containing layer having reduced stress.

Table 2 shows results from a post-deposition plasma treatment of DLC films. Examples 5-7 (Film A) are ~5,500 Å DLC films made with the same carbon deposition operation but with different post-deposition plasma treatments. Examples 8-10 (Film B) are ~5,300 Å DLC films made with the same carbon deposition operation but with different post-deposition plasma treatments. Post-deposition plasma treatment was performed on the DLC films using argon (flow rate of about 700 sccm), helium (flow rate of about 1200 sccm), pressure (about 25 mTorr), and the plasma power (RF bias power) shown in Table 2. Results for the post-deposition plasma treatment are shown in Table 2.

TABLE 2

|  | Film A | | | Film B | | |
| --- | --- | --- | --- | --- | --- | --- |
| Property | Ex. 5 | Ex. 6 | Ex. 7 | Ex. 8 | Ex. 9 | Ex. 10 |
| Thickness of DLC layer, Å | 5,525 | 5,519 | 5,515 | 5,315 | 5,325 | 5,318 |
| Plasma power, W | 200 | 500 | 800 | 200 | 500 | 800 |
| Stress, MPa | −261 | −193 | −182 | −315 | −258 | −250 |
| Range/2 non-uniformity | 6.3% | 6.3% | 6.3% | 5.7% | 5.6% | 5.7% |
| Refractive index at 633 nm | 2.375 | 2.374 | 2.372 | 2.389 | 2.386 | 2.385 |
| $sp^3$-hybridized atom content, % | 60.6 ± 0.1 | 60.7 ± 0.1 | — | 61.5 ± 0.4 | 61.4 ± 0.3 | — |

Table 2 shows that the post-deposition plasma treatment reduces the film stress of the DLC layer for both the films, while the refractive index, non-uniformity, and spa-content remains similar.

New and improved processes are described herein that overcome one or more deficiencies of conventional methods of forming hardmasks. Embodiments described herein enable, e.g., mitigation of wiggling issues and reduction of film stress of the carbon-containing hardmasks. Accordingly, embodiments described herein enable, e.g., improved device performance.

As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including." Likewise whenever a composition, an element or a group of elements is preceded with the transitional phrase "comprising," it is understood that we also contemplate the same composition or group of elements with transitional phrases "consisting essentially of," "consisting of," "selected from the group of consisting of," or "is" preceding the recitation of the composition, element, or elements and vice versa.

For the purposes of this disclosure, and unless otherwise specified, all numerical values within the detailed description and the claims herein are modified by "about" or "approximately" the indicated value, and consider experimental error and variations that would be expected by a person having ordinary skill in the art.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

While the foregoing is directed to embodiments of the present disclosure, other and further embodiments of the disclosure can be devised without departing from the basic scope thereof, and the scope thereof is determined by the claims that follow.

What is claimed is:

1. A method of processing a substrate, comprising:
   positioning a substrate in a processing volume of a processing chamber;
   depositing a diamond-like carbon (DLC) layer on the substrate; and
   after depositing the DLC layer, reducing a film stress of the DLC layer by performing a plasma treatment, the plasma treatment comprising:
      flowing a non-reactive gas into the processing volume at a flow rate of about 500 sccm to about 5,000 sccm for a 300 mm-sized substrate, the non-reactive gas comprising argon; and
      generating a plasma from the non-reactive gas in the processing volume to treat the DLC layer by applying a radio frequency (RF) bias power of about 100 W to about 10,000 W.

2. The method of claim 1, wherein the RF bias power is from about 100 W to about 400 W.

3. The method of claim 1, wherein the non-reactive gas further comprises helium, $N_2$, or combinations thereof.

4. The method of claim 1, wherein the non-reactive gas further comprises $N_2$, helium, neon, krypton, xenon, radon, or combinations thereof.

5. The method of claim 4, wherein a thickness of the DLC layer is from 5 kÅ to 15 kÅ.

6. The method of claim 1, wherein depositing the DLC layer and performing the plasma treatment are performed in the same processing chamber.

7. The method of claim 1, wherein:
the substrate is maintained at a temperature from about −40° C. to about 40° C. during the plasma treatment;
the processing volume is maintained at a pressure from about 1 mTorr to about 500 mTorr during the plasma treatment; or
a combination thereof.

8. The method of claim 7, wherein, during the plasma treatment:
the temperature of the substrate is maintained at about −10° C. to about 10° C.; and
the pressure of the processing volume is maintained at about 5 mTorr to about 100 mTorr;
or combinations thereof.

9. The method of claim 1, wherein the RF bias power is from about 200 W to about 5,000 W.

10. The method of claim 1, wherein an $sp^3$-content of the DLC layer after the plasma treatment is about 60% or more, as determined by Raman spectroscopy.

11. The method of claim 1, wherein the film stress of the DLC layer is reduced by about 10% to about 50%, as determined by ellipsometry.

12. A method of processing a substrate, comprising:
positioning a substrate in a processing volume of a processing chamber;
depositing a diamond-like carbon (DLC) layer on the substrate; and
after depositing the DLC layer, reducing a film stress of the DLC layer by performing a plasma treatment, the plasma treatment comprising:
flowing a non-reactive gas into the processing volume at a flow rate of about 500 sccm to about 5,000 sccm for a 300 mm-sized substrate, the non-reactive gas comprising argon; and
generating a plasma from the non-reactive gas in the processing volume to treat the DLC layer by applying a radio frequency (RF) bias power of about 100 W to about 1,000 W.

13. The method of claim 12, wherein the non-reactive gas further comprises helium, $N_2$, or combinations thereof.

14. The method of claim 12, wherein the non-reactive gas comprises $N_2$, helium, neon, krypton, xenon, radon, or combinations thereof.

15. The method of claim 14, wherein a thickness of the DLC layer is from 5 kÅ to 15 kÅ.

16. The method of claim 12, wherein the performing the plasma treatment further comprises:
maintaining the substrate at a temperature from about −40° C. to about 40° C.;
maintaining the processing volume at a pressure from about 1 mTorr to about 500 mTorr;
an RF bias power from about 100 W to about 400 W; or combinations thereof.

17. The method of claim 16, wherein the temperature is from about −10° C. to about 10° C., the pressure is from about 5 mTorr to about 100 mTorr, or a combination thereof.

18. A method of processing a substrate, comprising:
positioning a substrate in a processing volume of a processing chamber;
depositing a diamond-like carbon (DLC) layer on the substrate; and
after depositing the DLC layer, reducing a film stress of the DLC layer by performing a plasma treatment, the plasma treatment comprising:
flowing a non-reactive gas into the processing volume at a flow rate of about 500 sccm to about 5,000 sccm for a 300 mm-sized substrate, the non-reactive gas comprising argon and one or more of $N_2$ or helium;
generating a plasma from the non-reactive gas in the processing volume to treat the DLC layer by applying a radio frequency (RF) bias power of about 1,000 W or less; and
maintaining the substrate at a temperature from about −40° C. to about 40° C. during the plasma treatment.

19. The method of claim 18, wherein the processing volume is at a pressure from about 1 mTorr to about 500 mTorr during plasma treatment.

20. The method of claim 19, wherein, during the plasma treatment:
the temperature of the substrate is from about −10° C. to about 10° C.; and the pressure is from about 5 mTorr to about 100 mTorr.

* * * * *